United States Patent
Tran et al.

(10) Patent No.: US 7,806,383 B2
(45) Date of Patent: Oct. 5, 2010

(54) SLIT VALVE

(75) Inventors: Toan Q. Tran, San Jose, CA (US); Dimitry Lubormirsky, Cupertino, CA (US); Lun Tsuei, Mountain View, CA (US); Won Bang, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 656 days.

(21) Appl. No.: 11/756,632

(22) Filed: Jun. 1, 2007

(65) Prior Publication Data

US 2008/0296304 A1     Dec. 4, 2008

(51) Int. Cl.
*F16K 25/00*     (2006.01)
(52) U.S. Cl. .................... 251/193; 251/175; 251/328
(58) Field of Classification Search ................ 251/175, 251/193, 326, 327, 328
See application file for complete search history.

(56) References Cited

U.S. PATENT DOCUMENTS

| | | | | |
|---|---|---|---|---|
| 1,135,280 A | * | 4/1915 | Hamilton | 251/274 |
| 4,809,950 A | * | 3/1989 | Geiser | 251/328 |
| 4,921,213 A | * | 5/1990 | Geiser | 251/328 |
| 5,143,350 A | * | 9/1992 | Illy et al. | 251/326 |
| 5,271,602 A | * | 12/1993 | Funaba | 251/335.3 |
| 5,579,718 A | | 12/1996 | Freerks | |
| 5,820,104 A | * | 10/1998 | Koyano et al. | 251/326 |
| 6,056,267 A | | 5/2000 | Schneider | |
| 6,079,693 A | | 6/2000 | Ettinger et al. | |
| 6,905,107 B2 | * | 6/2005 | Blahnik | 251/195 |
| 2003/0129044 A1 | | 7/2003 | Kunze et al. | |

FOREIGN PATENT DOCUMENTS

KR     1020050062751 A     6/2005

OTHER PUBLICATIONS

Korean Notice to File a Response dated Sep. 29, 2008 for Korean Patent Application No. 10-2007-0088295.

* cited by examiner

*Primary Examiner*—John K Fristoe, Jr.
(74) *Attorney, Agent, or Firm*—Moser IP Law Group

(57) ABSTRACT

Embodiments of a valve assembly for a process chamber having improved seal performance are provided herein. In some embodiments, a valve assembly for a process chamber includes a housing having an opening disposed in a wall thereof and through which a substrate may be transferred; a door movably coupled to the housing in a plane substantially parallel to the wall of the housing for selectively sealing the opening; a compressible sealing member disposed at least partly between an upper surface of the door and a corresponding surface of the housing for forming a seal therebetween by compression of the compressible sealing member in a direction substantially perpendicular to the wall when the door is in a closed position; and a mechanism for restricting the exposure of the compressible sealing member to an environment on a process chamber side of the housing.

16 Claims, 6 Drawing Sheets

SLIT VALVE

BACKGROUND OF THE INVENTION

1. Field of the Invention

The present invention generally relates to process chambers used for processing substrates, and more specifically to methods and apparatus for protecting slit valve sealing members from degradation due to conditions in the process chamber.

2. Description of the Related Art

Processing systems for manufacturing integrated circuits (IC) on substrates generally include process chambers for performing various processes on substrates to form the various features and structures that make up the IC.

The process chamber generally includes a slit valve for selectively sealing the chamber during processing, while facilitating entry and egress of a substrate into and out of the process chamber. The slit valve generally includes a housing having an elongated opening, often referred to as a slit valve opening, for providing the physical access to the chamber. For example, the slit valve opening may be used to transfer substrates between a process chamber and a transfer chamber coupled to the process chamber. The slit valve further includes a door and a compressible sealing member that provides a seal when the door is in a closed position. The compressible sealing member generally maintains an air-tight seal in the process chamber (to prevent leakage into or out of the chamber, to facilitate maintaining non-atmospheric conditions inside the chamber, and the like)., However, many processes typically employed to fabricate the ICs in these process chambers (such as chemical vapor deposition (CVD), physical vapor deposition (PVD), etch processes, and the like) often result in volatile and corrosive gases in the process chamber. These corrosive gases may attack the compressible sealing member of the slit valve. Such attack may cause degradation of the sealing member, leading to particulate formation (which may contaminate the substrate) and/or failure of the sealing member (which may lead to leakage of process gases or instability of process conditions within the process chamber). Alternatively, the sealing member (and/or the slit valve or components thereof) may be frequently replaced to prevent the above-referenced degradation over time, thereby causing increased downtime and maintenance costs and lower process throughput.

Therefore, there is a need for a slit valve that reduces the exposure of the compressible sealing member to gases present in the process chamber.

SUMMARY OF THE INVENTION

Embodiments of a valve assembly for a process chamber having improved seal performance are provided herein. In some embodiments, a valve assembly for a process chamber includes a housing having an opening disposed in a wall thereof and through which a substrate may be transferred; a door movably coupled to the housing in a plane substantially parallel to the wall of the housing for selectively sealing the opening; a compressible sealing member disposed at least partly between an upper surface of the door and a corresponding surface of the housing for forming a seal therebetween by compression of the compressible sealing member in a direction substantially perpendicular to the wall when the door is in a closed position; and a mechanism for restricting the exposure of the compressible sealing member to an environment on a process chamber side of the housing.

In some embodiments, a substrate processing system includes a process chamber having an opening formed in a sidewall thereof; and a valve assembly disposed proximate the opening for selectively sealing the opening, the valve assembly including a housing having an opening disposed in a wall thereof and through which a substrate may be transferred; a door movably coupled to the housing in a plane substantially parallel to the wall of the housing for selectively sealing the opening; a compressible sealing member disposed at least partly between an upper surface of the door and a corresponding surface of the housing for forming a seal therebetween by compression of the compressible sealing member in a direction substantially perpendicular to the wall when the door is in a closed position; and a mechanism for restricting the exposure of the compressible sealing member to an environment on a process chamber side of the housing.

In another aspect of the invention, a method of manufacturing a valve assembly is provided. In some embodiments. A method of manufacturing a valve assembly includes providing a valve assembly having a housing, a door, and a compressible sealing member for forming a seal therebetween when the door is in a closed position; and providing a manifold to the valve assembly, the manifold having an inlet and a plurality of gas holes configured to fluidly couple the manifold and a region proximate the compressible sealing member when the door is in a closed position so that a pressurize gas delivered to the manifold at least partially forms a gas curtain that impinges upon or flows proximate the compressible sealing member when the door is in a closed position.

BRIEF DESCRIPTION OF THE DRAWINGS

So that the manner in which the above recited features of the present invention can be understood in detail, a more particular description of the invention, briefly summarized above and others described below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images used in the drawings are simplified for illustrative purposes and are not necessarily depicted to scale.

DETAILED DESCRIPTION

The present invention provides a slit valve suitable for use in a process chamber, such as in a semiconductor processing apparatus, wherein the slit valve may be exposed to a damaging environment due to, for example, corrosive gases. The slit valve generally comprises a valve assembly having a housing, a door, a compressible sealing member, and a mechanism for protecting the compressible sealing member. The housing includes an opening disposed in a wall thereof to facilitate transfer of a substrate through the housing, for example, from one chamber to another. The housing further includes a sealing surface disposed above the opening and formed substantially perpendicular to the wall. The door is movably coupled to the housing in a plane substantially parallel to the wall of the housing and is used for selectively sealing the opening. The compressible sealing member is disposed on an upper surface of the door for engaging the sealing surface of the housing and forming a seal therewith when the door is in a closed position.

The mechanism restricts the exposure of the compressible sealing member to an environment on a process chamber side of the housing. In some embodiments, the housing may include a manifold formed in the housing proximate to the sealing surface having a plurality of gas holes that extend from the manifold to an outer surface of the housing. The plurality of gas holes facilitate delivery of a pressurized gas to impinge upon the compressible sealing member when the door is in a closed position, thereby forming a gas curtain that limits other process gases from contacting the compressible sealing member. Alternatively or in combination, the housing may include a physical barrier. The physical barrier may be disposed sufficiently proximate the compressible sealing member when the door is in a closed position to define a small gap therebetween. The physical barrier shelters the compressible sealing member from direct exposure to process gases that may be present in the process chamber.

Figure 1:
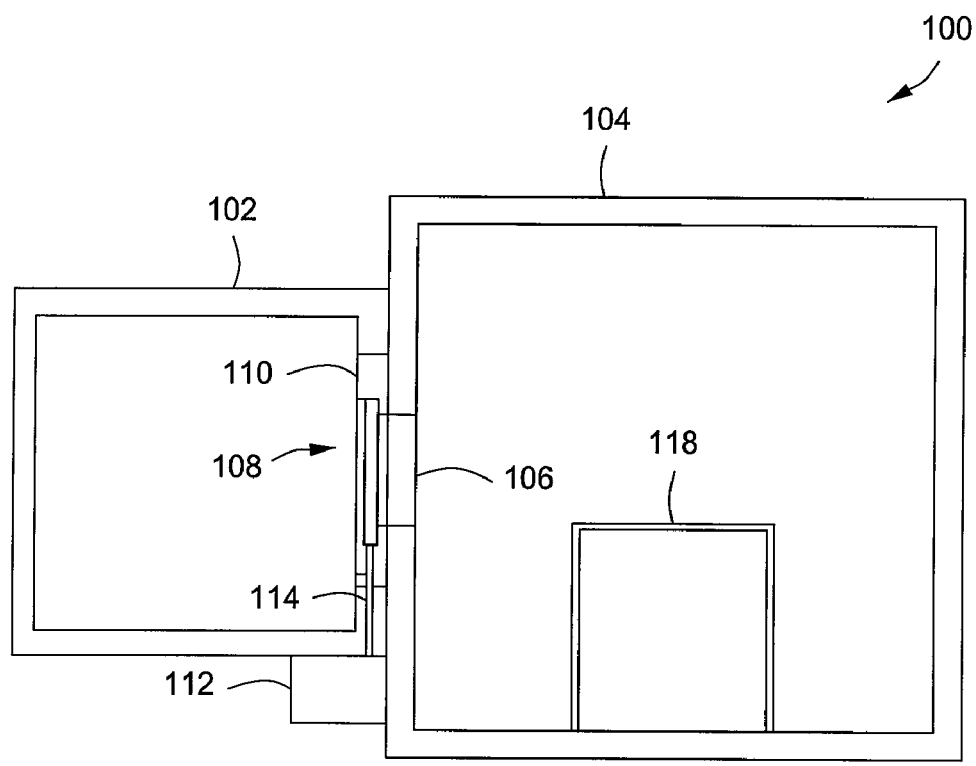
FIG. 1 shows a simplified block diagram of a substrate processing system in accordance with some embodiments of the invention.

While described herein as being used in a semiconductor processing apparatus, the slit valve assembly disclosed herein may be utilized in any chamber where it is desired to prevent a corrosive environment within the chamber from attacking a seal of the slit valve assembly. For example, FIG. 1 is a simplified block diagram illustrating an exemplary substrate processing system 100, in accordance with some embodiments of the invention. In some embodiments, the substrate processing system 100 may be a vacuum processing system, such as a semiconductor processing apparatus. The substrate processing system 100 may include a process chamber 104 having a substrate support 118 disposed therein. Additional components typically present in a variety of process chambers (such as process gas inlets, exhaust pumps, controllers, RF generators or other plasma sources, and the like) are omitted for clarity.

Substrates are typically transferred into and out of the process chamber 104 as the substrate moves through a desired fabrication sequence. For example, a transfer chamber 102 may be coupled to the process chamber 104 to facilitate placing a substrate on, or removing the substrate from, the substrate support 118. An opening 106 is disposed in respective adjacent walls of the transfer chamber 102 and the process chamber 104 to facilitate transfer of a substrate into and out of the process chamber 104. A valve assembly 108 is disposed proximate the opening 106 to facilitate selectively sealing the opening 106.

The valve assembly 108 includes a door 110 movable to selectively seal the chamber 104. The door 110 may be movable in a direction generally parallel to the plane of the opening 106. An actuator 112, such as a pneumatic actuator, a hydraulic actuator, a motor, or the like, is coupled to the door 110 via one or more rods 112. Operation of the actuator 112 thus controls the selective opening and closing of the door 110.

Figure 2A:
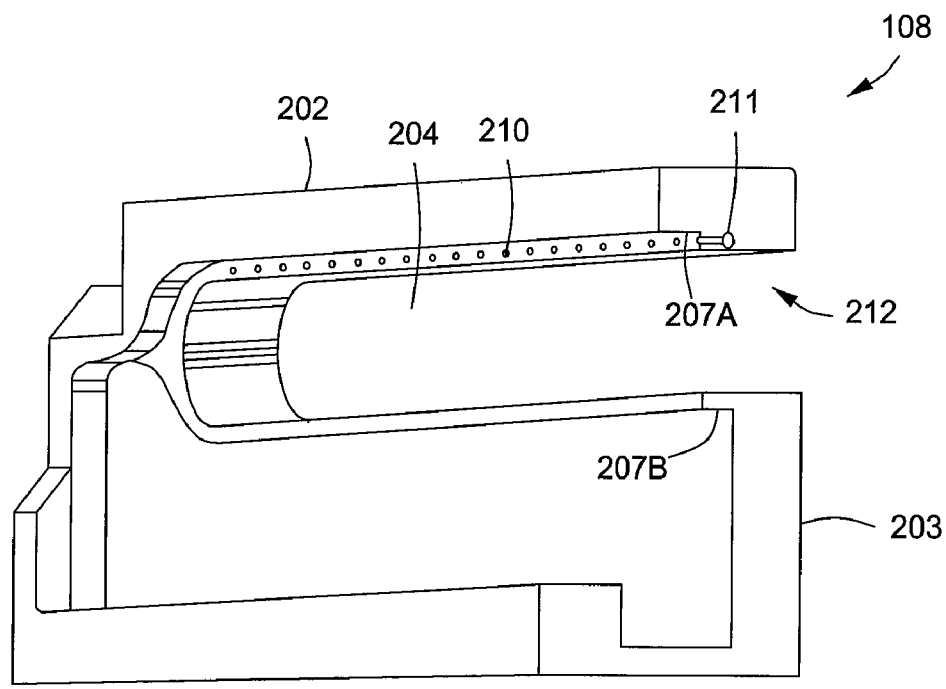
FIG. 2A illustrates a perspective view of a valve assembly in accordance with some embodiments of the invention.
Figure 2B:
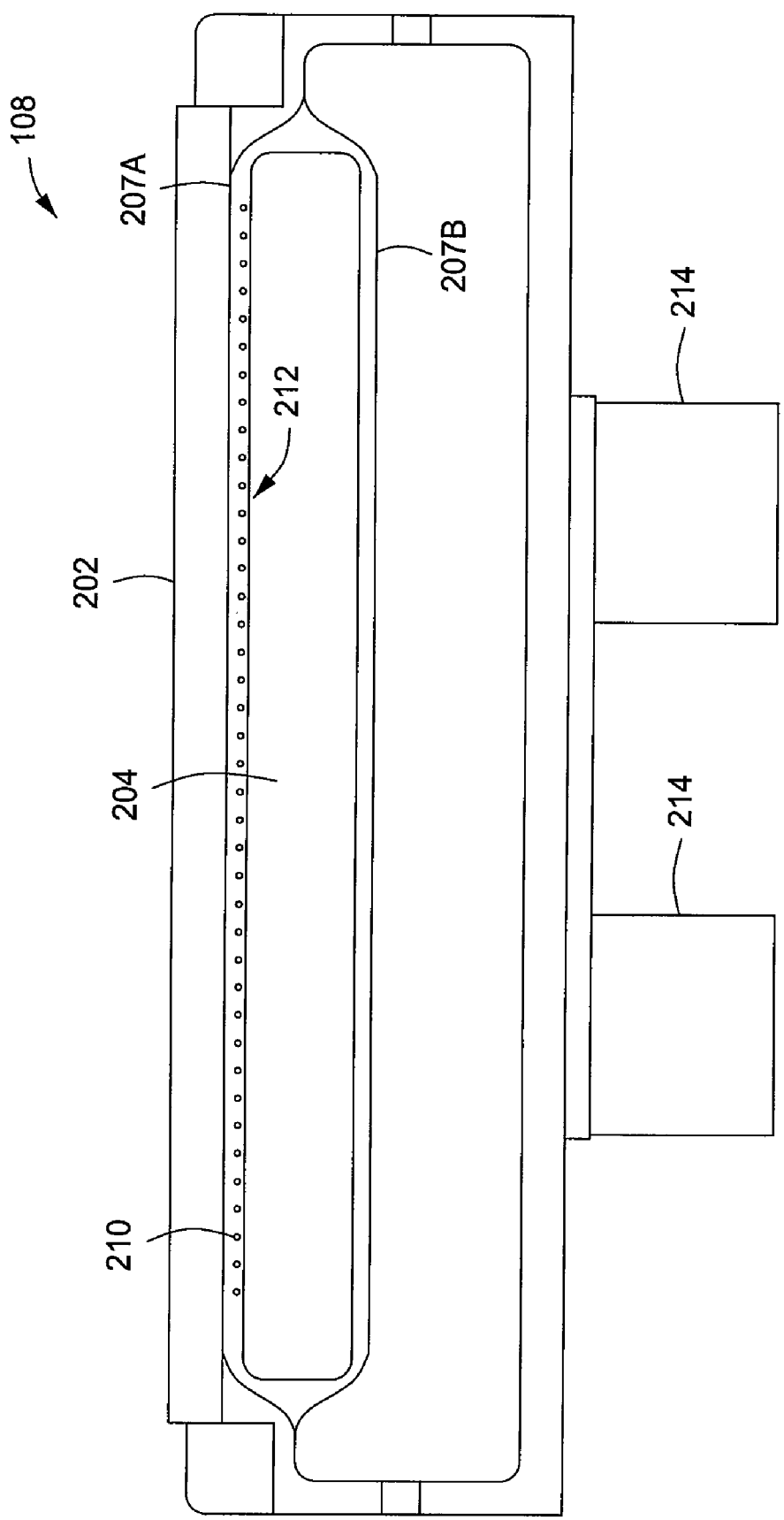
FIG. 2B illustrates a front view of a valve assembly in accordance with some embodiments of the invention.
Figure 2C:
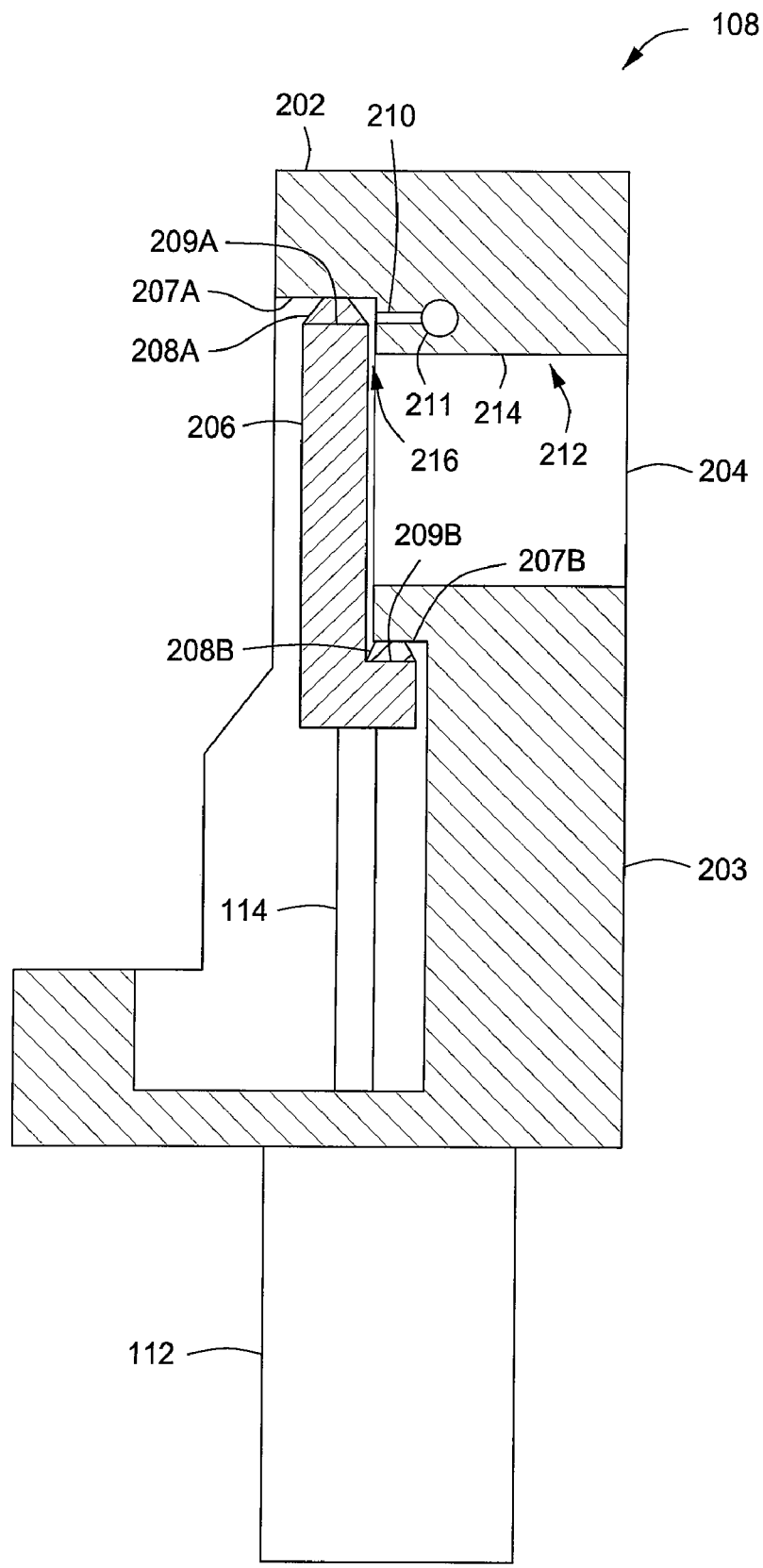
FIG. 2C illustrates a side view of a valve assembly in accordance with some embodiments of the invention.

FIGS. 2A, 2B, 2C respectively illustrate perspective, front, and side views of the valve assembly 108, in accordance with some embodiments of the invention. The valve assembly 108 generally includes a housing having an opening, a door, a compressible sealing member, and a mechanism to protect the compressible sealing member. For example, as shown in FIG. 2A, the valve assembly 108 may include a housing 202 having an opening 204 disposed in a wall 203 thereof. The opening 204 is sized to facilitate transferring a substrate therethrough. The housing 202 may be fabricated from any suitable materials, such as aluminum, and may include one or more sealing surfaces formed thereon to facilitate forming a seal with the compressible sealing member as described below. In the embodiment depicted in FIGS. 2A-C, the housing 202 may have an upper sealing surface 207A disposed above the opening 204 and a lower sealing surface 207B disposed below the opening 204. The upper and lower sealing surfaces 207A, 207B may be formed substantially perpendicular to the wall 203.

As shown in FIG. 2C, the valve assembly 108 further includes a door 206. The door 206 is movably coupled to the housing 202 proximate the opening 204 in a plane substantially parallel to the wall 203 of the housing 202 and is used (with the compressible sealing member) for selectively sealing the opening 204. In some embodiments of the invention, opening and closing the door 206 is accomplished with linear movement only. The door 206 may be fabricated from the same materials described above as suitable for the housing 202.

The door 206 generally has corresponding surfaces that interface with the sealing surfaces provided in the housing (such as sealing surfaces 207A, 207B in the housing 202). In the embodiment depicted in FIGS. 2A-C, and as specifically shown in FIG. 2C, the door 206 may include a first surface 209A configured to interface with the upper sealing surface 207A and a second surface 209B configured to interface with the lower sealing surface 207B. In some embodiments, to facilitate a robust seal, the upper and lower sealing surfaces 207A, 207B on the housing 202 and the first and second surfaces 209A, 209B on the door 206 may be disposed substantially perpendicular to the direction of movement of the door 206, and/or the upper and lower sealing surfaces 207A, 207B and the first and second surfaces 209A, 209B may be disposed substantially parallel to each other.

A compressible sealing member may be disposed between the door 206 and the housing 202 (for example, between sealing surfaces 207A, 207B and first and second surfaces 209A, 209B) to facilitate forming a seal therebetween when the door 206 is in the closed position. In the embodiment depicted in FIGS. 2A-C, and as specifically shown in FIG. 2C, an upper seal 208A (such as an O-ring, gasket, or the like) may be disposed on the first surface 209A of the door 206 and a lower seal 208B may be disposed on the second surface 209B of the door 206 for engaging the sealing surfaces 207A, 207B of the housing 202 when the door 206 is in a closed position. Alternatively, one or more of the seals 208A, 208B may be disposed on the respective sealing surface 207A, 207B of the housing 202. It is contemplated that a single sealing element may be provided that is disposed along the desired surfaces (e.g., the first and second surfaces 207A, 207B of the door 206 or the sealing surfaces 207A, 207B of the housing 202) to provide the sealing capability as described herein.

The compressible sealing members (e.g., seals 208A, 208B) may be fabricated from any process compatible material (e.g., compatible with process temperatures, pressures, process gases, or the like) that is functionally suitable to provide the desired sealing characteristics during use (e.g., compressible and able to form a desired seal under process pressures). For example, the compressible sealing member may be formed from an elastomeric material such as a perfluoro elastomeric material, or more specifically, Chemraz® E-38, 513, and 520 materials, Kalrez® KLR 9100 and Sahara 8575, 8475, 8375, and 8385 materials, or the like.

The valve assembly 108 further includes one or more mechanisms to protect the compressible sealing member. The mechanism may protect the compressible sealing member by restricting exposure of the compressible sealing member to a process environment within process chamber, which may contain corrosive gases and/or reactive species from a plasma.

In some embodiments, a gas curtain or blanket of an inert gas may be provided to prevent or limit the contact of any corrosive elements within the process chamber from contacting the compressible sealing member. For example, in the embodiment depicted in FIGS. 2A-C, the housing 202 may further include a manifold 211 disposed therein and having a plurality of gas holes 210 distributed along the housing. The manifold 211 may be disposed proximate one or more of the sealing surfaces 207A, 208. The gas holes 210 may be positioned to direct a flow of inert gas to impinge upon the compressible sealing member, or to cause the inert gas to flow proximate the compressible sealing member to form a gas curtain between the compressible sealing member and any corrosive gases within the process chamber.

The size, number, and configuration of the manifold 211 may be selected as desired to control the flow rate and distribution of the gas curtain. In some embodiments, the diameter of the manifold 211 may be about 6.35 mm +/− about 0.08 mm. The size, spacing, geometry, number, of the gas holes 210 may be selected as desired to control the flow rate and distribution of the gas curtain. In some embodiments of the invention, the diameter of the gas holes may be about 0.30 mm +/− about 0.01 mm. In addition, the direction of any one or more of the gas holes 210 may be selected as desired to control the direction of flow of the gas curtain. For example, a portion of the holes 210 disposed near either side of the opening 204 may be angled one or more of horizontally or vertically to direct a portion of the gas curtain towards the compressible sealing member proximate the sides of the valve assembly 108.

Figure 5:
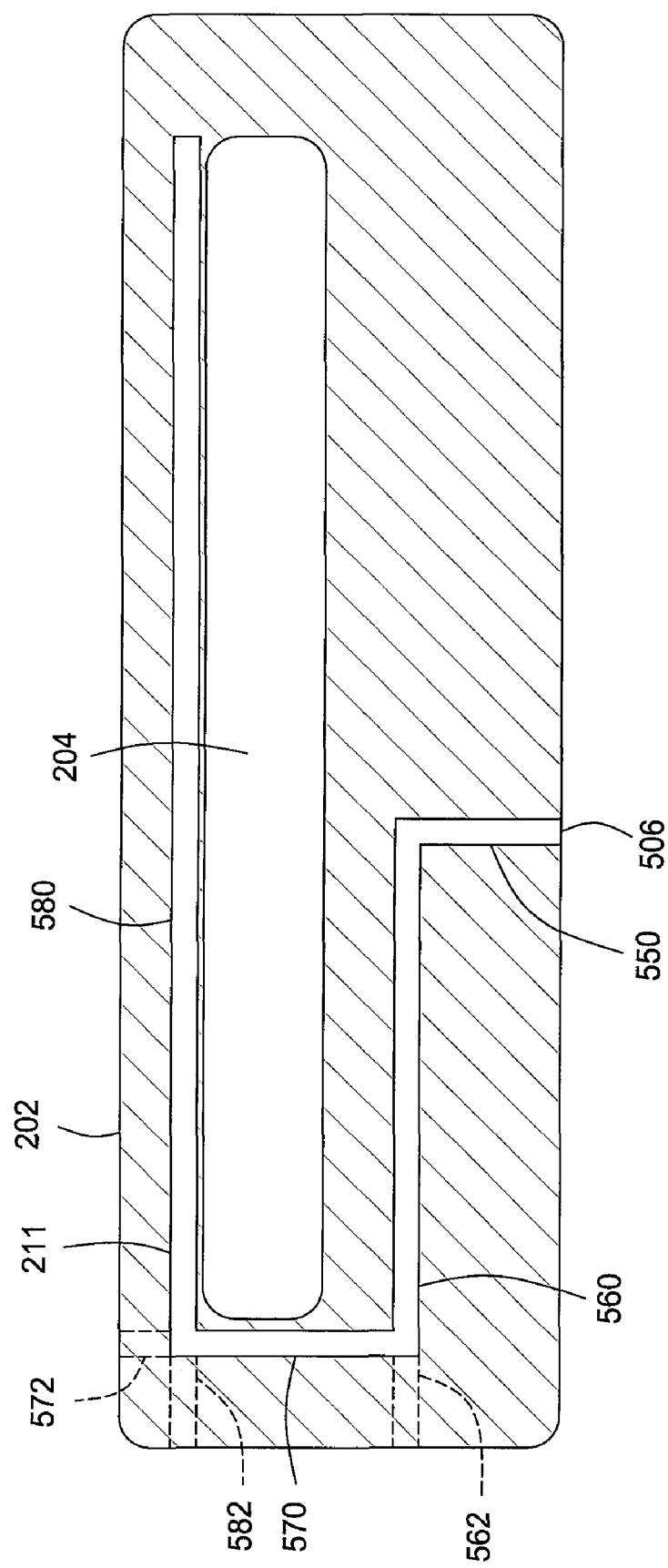
FIG. 5 illustrates a sectional front view of a valve assembly in accordance with some embodiments of the invention.

An inlet may generally be provided for coupling the manifold 211 to a gas supply (not shown). For example, FIG. 5 depicts an illustrative sectional front view of the housing 202 showing the manifold 211 in accordance with some embodiments of the invention. In the embodiment depicted in FIG. 5, the manifold 211 is routed through the housing 202 from an inlet 506, disposed in a bottom portion of the housing 202, to a location proximate the upper seating surface 207A (shown in FIGS. 2A-C). The inlet 506 may have a suitable fitting for connection to a gas line from a gas source (not shown).

The location of the inlet 506 shown in FIG. 5 is illustrative only, and other locations of inlets, or numbers of inlets and/or manifolds 211 are contemplated. The size of the inlet 506, and of the manifold 211 may be any suitable size to provide the desired gas flow within the valve assembly 108. In some embodiments, the diameter of the inlet 506 may be about 6.35 mm +/− about 0.08 mm. Although shown in an upper portion of the housing 202 in FIGS. 2A-C and FIG. 5, the manifold 211 (or other similar manifolds) may be provided in other portions of the housing (such as the sides, the lower portion of the housing, each side, and the like), or, alternatively or in combination, in one or more locations within the door 206.

The manifold 211 may be formed in any suitable manner, such as by machining a plurality of holes through the housing 202 and selectively sealing portions of the holes to define the desired path of the manifold 211. In one illustrative example, a plurality of holes 550, 560, 570, 580 may be machined into the housing 202. The holes 550, 560, 570, 580 intersect to form a fluid passage through the housing 202. Selective portions of the holes 550, 560, 570, 580 may be sealed (as shown in phantom by 562, 572, 582) to define the manifold 211. It is contemplated that other means for forming the manifold may be utilized, such as by routing the manifold at least partially externally to the housing 202, or forming portions of the manifold in one or more pieces of a multi-piece housing that defines the manifold upon assembly of the housing (such as halves of a vertically split housing), or the like.

Returning to FIGS. 2A-C, in operation, while the door 206 is in a closed position (for example, during processing) an inert gas may be provided from a gas source (not shown) to the manifold 211. The inert gas will exit the manifold 211 via the plurality of gas holes 210 to form a gas curtain proximate the compressible sealing member 208. The pressurized gas may be any process compatible inert gas such as nitrogen, noble gases, or other gas that is inert to the materials of the seal and not detrimental to the process occurring within the process chamber.

In some embodiments, the gas curtain may be formed prior to the supply of a process gas or prior to commencing processing within the process chamber to avoid initial exposure of the compressible sealing member to any corrosive atmosphere within the chamber. In some embodiments, the pressurized gas may be supplied at a predefined flow rate to form the gas curtain as desired and restrict the exposure of the compressible sealing member to any corrosive atmosphere within the chamber. In some embodiments, the gas curtain may continue to be provided for a predefined time after the completion of process, after purging the process chamber, and/or after opening the door 206, to further restrict the exposure of the compressible sealing member to any corrosive atmosphere within the chamber. The predefined time may be calculated based on the time required for the concentration of the process gases to reach to a predefined limit that practically does not degrade the compressible sealing member 208.

Alternatively or in combination, a physical barrier or obstruction may be provided to prevent or limit the contact of any corrosive elements within the process chamber from contacting the compressible sealing member. For example, in the embodiment depicted in FIGS. 2A-C, the housing 202 may further include a physical barrier 212 disposed between the compressible sealing member (seals 208A-B) and the opening 204 (or the interior of the process chamber) when the door 206 is in a closed position. The physical barrier 212 may be disposed sufficiently proximate the compressible sealing member to form a small gap 216 therebetween (as shown in FIG. 2C). The physical barrier 212 may be at least one of a protrusion (or corresponding recess), ledge, lip, flange, boss, wall, surface, or other member or element that provides an obstruction between the compressible sealing member and the opening 204 (or interior of the process chamber) when the door 206 is in a closed position.

In the embodiment depicted in FIGS. 2A-C, a wall 214 is provided in an upper portion of the opening 204 of the housing 202 to protect the seals 208A-B. Described another way, the sealing surface 208A may be formed in a recess or ledge formed in the upper portion of the opening 204. The physical barrier 212 may be formed by any suitable means. In some embodiments, the physical barrier 212 may be formed by machining a recess in the upper portion of the opening 204, attaching a layer of material to an upper surface of the opening 204, or the like, or combinations thereof. When attaching a layer of material the upper surface of the opening 204 (such as by bonding, brazing, welding, or the like), at least a portion of the manifold 211 may be disposed between the layer of material and the upper surface of the opening 204.

In operation, the wall 214 (or other physical barrier 212) restricts the corrosive gases in the process chamber from readily coming in contact with the compressible sealing members (e.g., seal 208A) when the door 206 is in a closed position. The physical barrier 212 is disposed sufficiently proximate the compressible sealing members to define a small gap 216 therebetween that restricts the flow of corrosive gases from reaching the compressible sealing members. In the embodiment depicted in FIGS. 2A-C, the seal 208B is disposed beneath a ledge in a lower portion of the opening 206 and is similarly protected.

The housing 202 of the valve assembly 108 may further include one or more openings (not shown) to facilitate actuation of the door 206, for example, by the rods 114 and actuator 112 described above with respect to FIG. 1. It is contemplated that other configurations of the housing 202 may be utilized that do not require openings in the housing 202.

Figure 3:
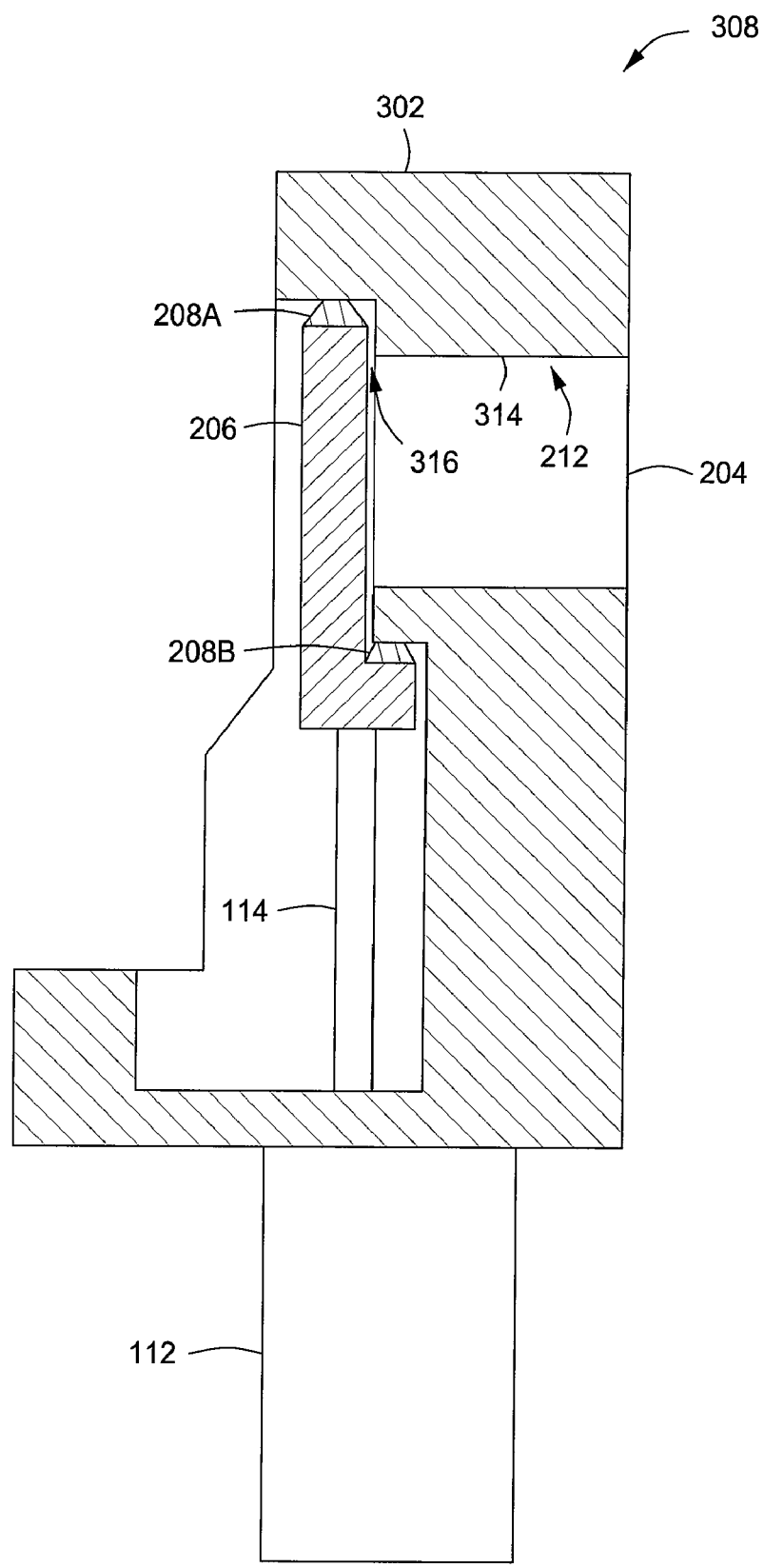
FIG. 3 illustrates a side view of a valve assembly in accordance with some embodiments of the invention.

As discussed above, the gas curtain and the physical barrier mechanisms may be independently provided. For example, FIG. 3 illustrates a valve assembly 308 having only a physical barrier 312 in accordance with some embodiments of the invention. The valve assembly 308 is similar to the valve assembly 108 except as described below. The valve assembly 308 includes a housing 302 illustratively having a wall 314 disposed in an upper portion of an opening 304 of the housing 302. The wall 314, or other physical barrier 312, (similar to the physical barrier 312 and wall 214 described above) defines a small gap 316 between the physical barrier 312 and the compressible sealing member (seal 208A). The wall 314 or other physical barrier 312 may be formed and may function as described above with respect to FIGS. 2A-C.

Figure 4:
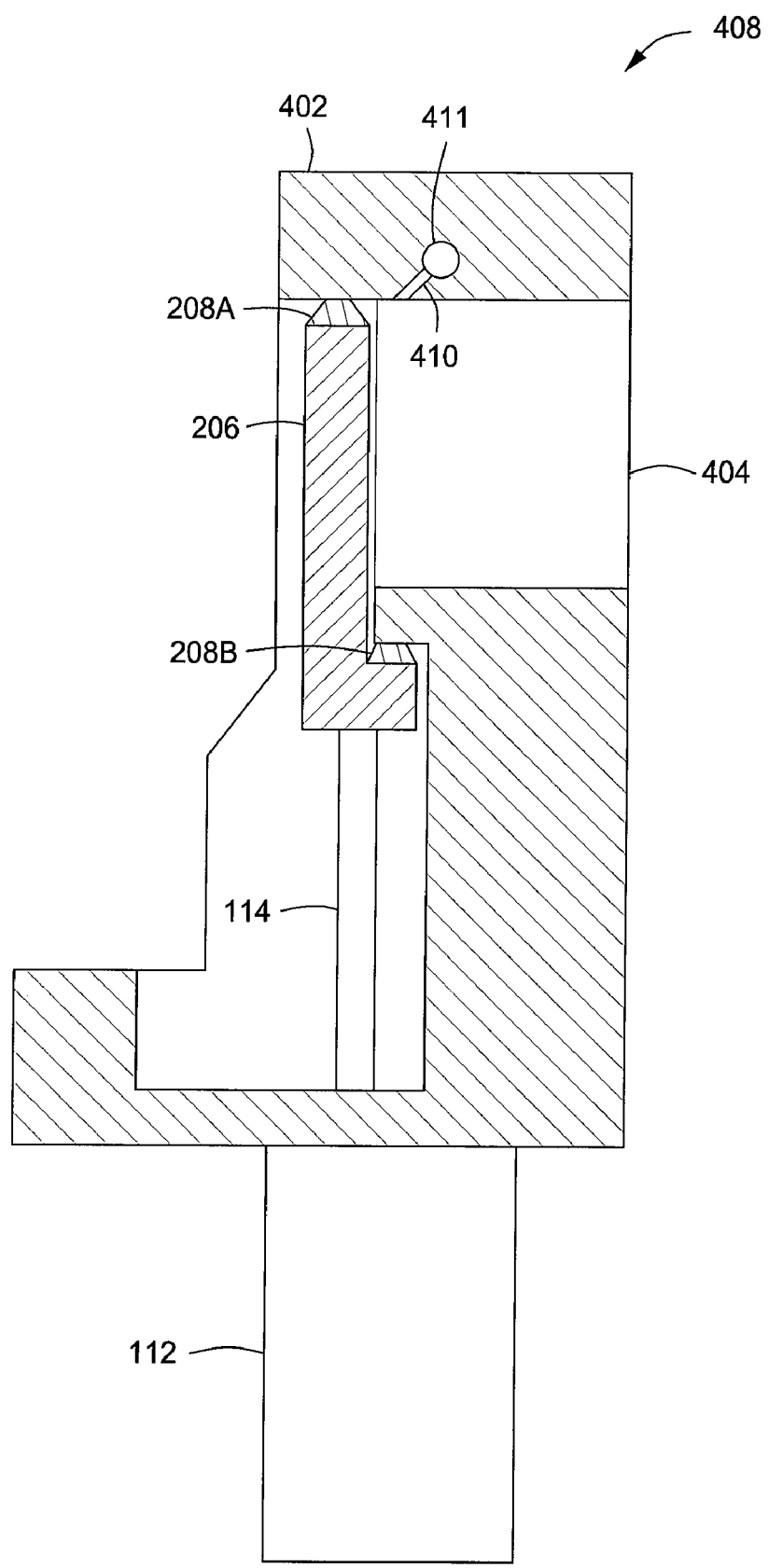
FIG. 4 illustrates a side view of a valve assembly in accordance with some embodiments of the invention.

In some embodiments, and as depicted in FIG. 4, a valve assembly 408 may be provided having only a gas curtain in accordance with some embodiments of the invention. The valve assembly 408 is similar to the valve assembly 108 except as described below. The valve assembly 408 includes a housing 402 illustratively having a manifold 411 and a plurality of gas holes 410 disposed in an upper portion of an opening 404 of the housing 402. The manifold 411 and the plurality of gas holes 410 may be formed and function as described above with respect to the manifold 211 and plurality of gas holes 210 of FIGS. 2A-C.

Thus, embodiments of a slit valve assembly having improved seal life and performance have been provided herein. The valve assembly advantageously restricts exposure of the sealing elements of the door to any corrosive atmosphere in a process chamber in which the valve is installed. Furthermore, processing systems incorporating the valve assembly have been described herein. Moreover, the manifold assembly may be retrofitted into existing processing systems.

For example, one or more manifolds may be formed in the housing, and/or optionally, the door of the valve assembly. A plurality of gas holes may be formed to fluidly couple the manifolds to a desired region of the valve assembly to facilitate creating and maintaining a gas curtain as described above. The manifolds may comprise an inlet and at least a portion disposed in a region that facilitates fluid coupling to the gas holes. In some embodiments, the manifolds may be formed by drilling a plurality of holes While the foregoing is directed to some embodiments of the present invention, other and further embodiments of the invention may be devised without departing from the basic scope thereof, and the scope thereof is determined by the claims that follow.

What is claimed is:

1. A valve assembly for a process chamber, comprising:
   a housing having an opening disposed in a wall thereof and through which a substrate may be transferred;
   a door movably coupled to the housing in a plane substantially parallel to the wall of the housing for selectively sealing the opening;
   a compressible sealing member disposed at least partly between an upper surface of the door and a corresponding surface of the housing for forming a seal therebetween by compression of the compressible sealing member in a direction substantially perpendicular to the wall when the door is in a closed position; and
   a mechanism for restricting the exposure of the compressible sealing member to an environment on a process chamber side of the housing, wherein the mechanism comprises a manifold formed in the housing proximate to the sealing surface and a plurality of gas holes formed in the housing and extending from the manifold to an outer surface of the housing for allowing a pressurize gas delivered to the manifold to impinge upon the compressible sealing member when the door is in a closed position.

2. The valve assembly of claim 1, wherein the housing further comprises:
   a sealing surface disposed above the opening and substantially perpendicular to the wall.

3. The valve assembly of claim 2, wherein the compressible sealing member is disposed on an upper surface of the door for engaging the sealing surface of the housing when the door is in a closed position.

4. The valve assembly of claim 1, wherein the mechanism further comprises a physical barrier disposed between the compressible sealing member and the opening when the door is in a closed position.

5. The valve assembly of claim 4, wherein the physical barrier comprises at least one of a protrusion, a ledge, or a recess.

6. A substrate processing system, comprising:
   a process chamber having an opening formed in a sidewall thereof; and
   a valve assembly disposed proximate the opening for selectively sealing the opening, the valve assembly comprising:
   a housing having an opening disposed in a wall thereof and through which a substrate may be transferred;
   a door movably coupled to the housing in a plane substantially parallel to the wall of the housing for selectively sealing the opening;
   a compressible sealing member disposed at least partly between an upper surface of the door and a corresponding surface of the housing for forming a seal therebetween by compression of the compressible sealing member in a direction substantially perpendicular to the wall when the door is in a closed position; and
   a mechanism for restricting the exposure of the compressible sealing member to an environment on a process chamber side of the housing, wherein the mechanism comprises a manifold formed in the housing proximate to the sealing surface and a plurality of gas holes formed in the housing and extending from the manifold to an outer surface of the housing for allowing a pressurize gas delivered to the manifold to impinge upon the compressible sealing member when the door is in a closed position.

7. The semiconductor processing apparatus of claim 6, wherein the housing further comprises:
a sealing surface disposed above the opening and substantially perpendicular to the wall.

8. The semiconductor processing apparatus of claim 7, wherein the compressible sealing member is disposed on an upper surface of the door for engaging the sealing surface of the housing when the door is in a closed position.

9. The valve assembly of claim 6, wherein the mechanism further comprises a physical barrier disposed between the compressible sealing member and the opening when the door is in a closed position.

10. The valve assembly of claim 9, wherein the physical barrier comprises at least one of a protrusion, a ledge, a lip, a flange, a boss, a wall, a surface, or a member.

11. A method of manufacturing a valve assembly, comprising:
providing a valve assembly having a housing, a door, and a compressible sealing member, the housing having an opening formed in a wall thereof, the door movable coupled to the housing in a direction substantially parallel to the wall, the compressible sealing member forming a seal between the door and the housing when the door is in a closed position; and
providing a manifold to the valve assembly, the manifold having an inlet and a plurality of gas holes configured to fluidly couple the manifold and a region proximate the compressible sealing member when the door is in a closed position so that a pressurize gas delivered to the manifold at least partially forms a gas curtain that impinges upon or flows proximate the compressible sealing member when the door is in a closed position.

12. The method of claim 11, wherein providing a manifold comprises:
forming a manifold in the door.

13. The method of claim 11, wherein providing a manifold comprises:
forming a manifold in the housing.

14. The method of claim 13, wherein forming a manifold in the housing further comprises:
forming a plurality of holes through the housing; and
selectively sealing portions of the holes to define a desired path of the manifold.

15. The method of claim 11, wherein providing a manifold comprises:
coupling a manifold to at least one of the door or the housing.

16. The method of claim 11, further comprising:
forming a protrusion in the opening proximate the position of the compressible sealing member when the door is in a closed position to define a small gap therebetween.

* * * * *